US009172395B2

(12) United States Patent
Liu et al.

(10) Patent No.: US 9,172,395 B2
(45) Date of Patent: Oct. 27, 2015

(54) GENERATING AN ICONV MODULE IN REAL TIME

(71) Applicant: International Business Machines Corporation, Armonk, NY (US)

(72) Inventors: Su Liu, Round Rock, TX (US); Rong Qu, Austin, TX (US); Teerasit Tinnakul, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 14/082,125

(22) Filed: Nov. 16, 2013

(65) Prior Publication Data

US 2015/0138003 A1 May 21, 2015

(51) Int. Cl.
*H03M 7/34* (2006.01)
*H03M 7/00* (2006.01)

(52) U.S. Cl.
CPC ....................................... *H03M 7/00* (2013.01)

(58) Field of Classification Search
CPC ........... H03M 7/00; H03M 7/40; H03M 7/30; H03M 9/00
USPC ...................................................... 341/50, 51
See application file for complete search history.

(56) References Cited

U.S. PATENT DOCUMENTS

| | | | | |
|---|---|---|---|---|
| 5,802,538 | A * | 9/1998 | Ooishi | 715/263 |
| 5,890,184 | A * | 3/1999 | Ooishi | 715/203 |
| 6,016,396 | A * | 1/2000 | Mochizuki | 717/149 |
| 6,999,082 | B2 | 2/2006 | Nishimura | |
| 7,199,729 | B2 | 4/2007 | Chen et al. | |
| 7,278,100 | B1 | 10/2007 | Ehrman | |
| 7,703,004 | B2 | 4/2010 | Bier | |
| 8,296,747 | B2 | 10/2012 | Ishizaki et al. | |
| 2013/0091155 | A1 | 4/2013 | Mineno et al. | |

OTHER PUBLICATIONS

Foller, “Online Sample of a CharSet property for conversion texts and files,” downloaded from <http://www.motobit.com/util/charset-codepage-conversion.asp> on Nov. 15, 2013, copyrighted 1996.
Haible, “Introduction to libiconv,” downloaded from <http://www.gnu.org/software/libiconv/> on Nov. 15, 2013, Aug. 7, 2011.

* cited by examiner

*Primary Examiner* — Jean B Jeanglaude
(74) *Attorney, Agent, or Firm* — Thomas E. Tyson; Gregory K. Goshorn; Greg Goshorn, P.C.

(57) ABSTRACT

Provided are techniques for detecting a mapping, by a universal convertor, of a first character set to a second character set and of the second character set to a third character set; monitoring, logging, and analyzing code set conversion (CSC) operations; generating an updated character set conversion module from the first character set to the third character set in response to the detecting and a determination that the CSC operation exceed the predefined threshold; and storing the updated character set conversion module for utilization of subsequent processing of the first character set to the third character set.

20 Claims, 7 Drawing Sheets

GENERATING AN ICONV MODULE IN REAL TIME

FIELD OF DISCLOSURE

The claimed subject matter relates generally to computing systems and, more specifically, to techniques for the conversion of code sets in multi-national server operation systems.

BACKGROUND OF THE INVENTION

Any particular computing system may employ one or more of potentially thousands of different code sets, also known as character sets, charsets and code pages. Converting strings of data from one code set to another is an important utility necessary in many computing systems, particularly in multi-national, server operation systems. Such a utility, or code set convertor (CSC), may be a first step in applications such as, but not limited to, information exchange, security authorization, data transfer and database access. CSCs are essential for providing reliable communications across computing platforms and networks. Thousands of CSCs are supported based upon different requirements and standards worldwide. Currently, a CSC is configured by selecting a specific CSC component that is specific to the source code set and the target code set. Finding, choosing and loading the specific CSC component are critical for services that require code set conversion.

UNIX servers, such as AIX®, use an open architecture to manage the tasks associated with code set conversion. An iconv application programming interface (API) is a well-known programming interface in UNIX-like systems for converting from one character encoding type to another. Although a new CSC can be added or modified in a system without rebooting the system, locating the correct CSC from among the thousands available can create a bottleneck on system performance. To reduce computing time and power usage, existing iconv APIs provide three (3) conversion algorithms and a four-level CSC lookup structure. One of the three algorithms is one-to-one mapping, i.e., A→N, which may also include transitive properties, i.e., A→X and X→N. A second algorithm involves programming based conversion, i.e., many-to-one or many-to-many. A third algorithm uses a combination of the first and second algorithms.

Universal Conversion Modules (UCMs) typically find intermediate converters when a simple CSC is not available. For example, when a code set A is needed to be converted to a code set N, one CSC may convert code set A to X and an intermediate CSC may convert X to C. Depending upon the number of intermediate CSCs, such a system may take double or triple the operation time of a single CSC.

SUMMARY

Provided are techniques for detecting a mapping, by a universal convertor, of a first character set to a second character set and of the second character set to a third character set; monitoring, logging, and analyzing code set conversion (CSC) operations; generating a updated character set conversion module from the first character set to the third character set in response to the detecting and a determination that the CSC operation exceed the predefined threshold; and storing the updated character set conversion module for utilization of subsequent processing of the first character set to the third character set.

This summary is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed description.

BRIEF DESCRIPTION OF THE DRAWINGS

A better understanding of the claimed subject matter can be obtained when the following detailed description of the disclosed embodiments is considered in conjunction with the following figures, in which:

DETAILED DESCRIPTION

Figure 1:
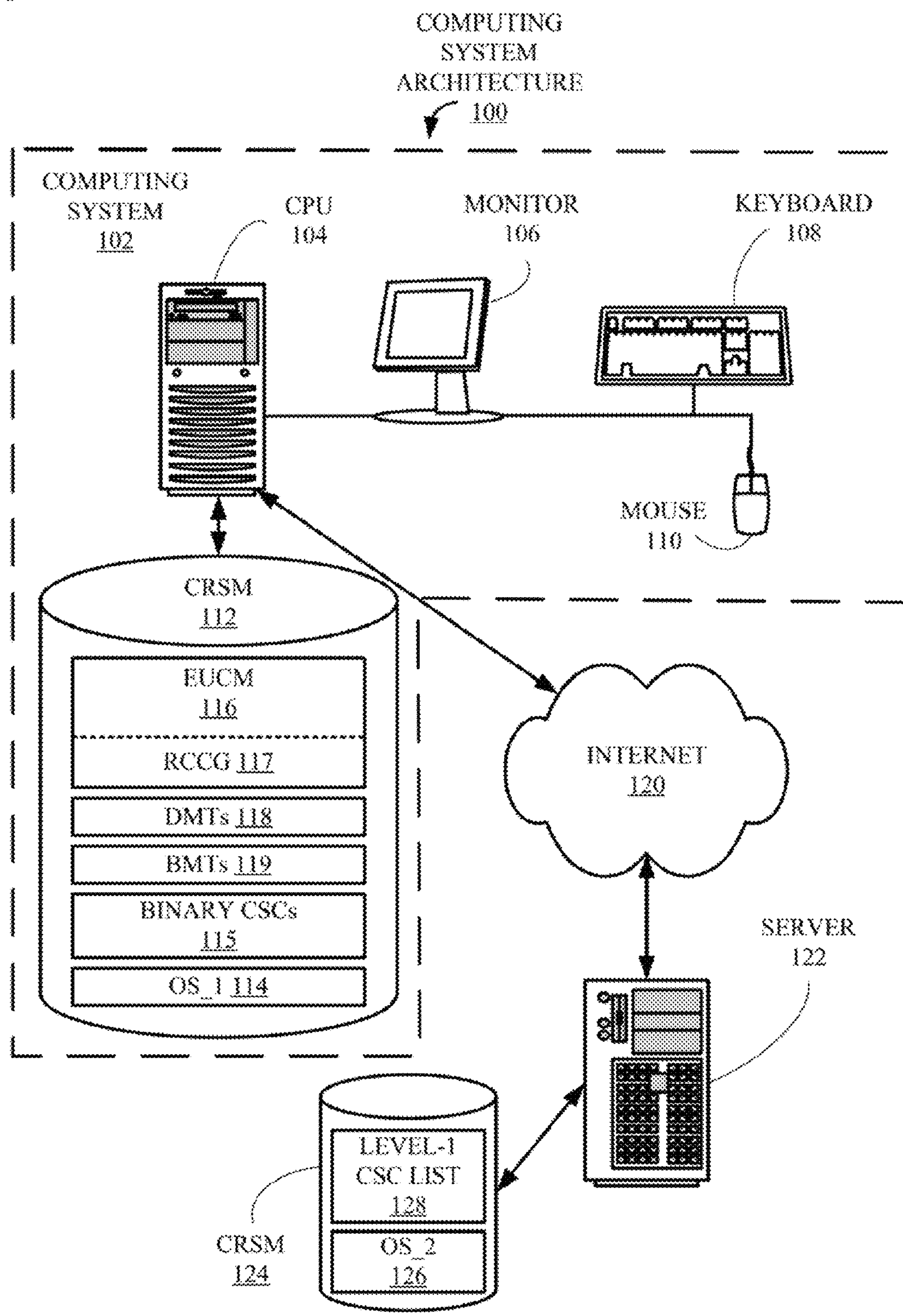
FIG. 1 is a block diagram of a computing system that may support an implementation of the claimed subject matter.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational actions to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Turning now to the figures, FIG. 1 is a block diagram of one example of a computing system architecture 100 that may implement the claimed subject matter. A computing system 102 includes a central processing unit (CPU) 104, coupled to a monitor 106, a keyboard 108 and a pointing device, or "mouse," 110, which together facilitate human interaction with elements of architecture 100 and computing system 102. Also included in computing system 102 and attached to CPU 104 is a computer-readable storage medium (CRSM) 112, which may either be incorporated into computing system 102 i.e. an internal device, or attached externally to CPU 104 by means of various, commonly available connection devices such as but not limited to, a universal serial bus (USB) port (not shown).

CRSM 112 is illustrated storing an operating system (OS), i.e. an OS_1 114, Binary Code Set Convertors (CSCs) 115 and an Extended Universal Convertor Module (EUCM) 116 that incorporates the claimed subject matter. EUCM 116 includes a Run-Time Code Set Conversion Generator (RCCG) 117. CRSM 112 also stores Default Mapping Tables (DMTs) 118 and Backup Mapping Tables (BMTs) 119. CSCs 115, EUCM 116, RCCG 117, DMTs 118 and BMTs 119 are described in more detail below in conjunction with FIGS. 2-7.

In this example, computing system 102 and CPU 104 are connected to the Internet 120, which is also connected to a server computer, or simply "server," 122. Although in this example, computing system 102 and server 122 are communicatively coupled via the Internet 120, they could also be coupled through any number of communication mediums such as, but not limited to, a local area network (LAN) (not shown). Server 122 is also coupled to a CRSM, i.e. a CRSM 124 and, although now shown would also typically have a CPU, monitor, keyboard and pointing device like CPU 104, monitor 106, keyboard 108 and mouse 110. Server 122 is illustrated executing an OS, i.e. an OS_2 126, stored on CRSM 124, which also stores a list of available code set convertors, or a Level-1 CSC list 128. Level-1 CSC list represents one example of a repository of potentially thousands of possible CSCs that are typically available to computing systems for code set conversion.

Examples of OSs that may be employed in conjunction with the claimed subject matter include, but are not limited to, SOLARIS®, HP-UX®, AIX® and so on. Those with skill in the relevant arts should realize that the claimed subject matter is equally applicable, but not limited to, performance issues on data transactions, analytic and operational deployment of standalone, portable, embedded, networked, clustered, portioned and could operating systems, and database appliances. Further, it should be noted there are many possible computing system configurations, of which computing system architecture 100 is only one simple example.

Figure 2:
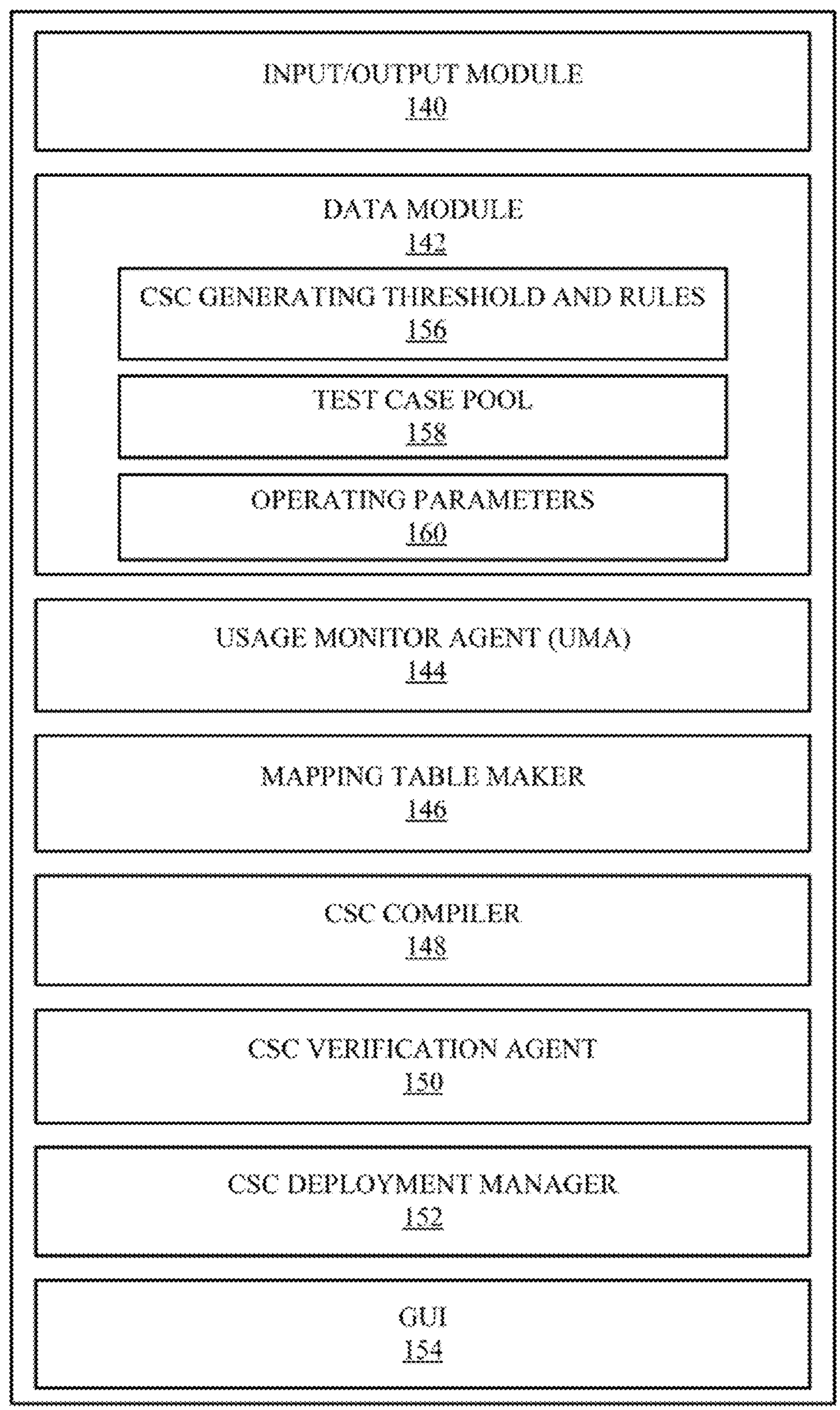
FIG. 2 is a block diagram a Run-Time Code Set Conversion Generator (RCCG) that may implement aspects of the claimed subject matter.

FIG. 2 is a block diagram of RCCG 117, introduced above in FIG. 1, in greater detail. RCCG 117 includes an input/output (I/O) module 140, a data module 142, a usage monitor agent (UMA) 144, a mapping table maker 146, a CSC compiler 148, a CSC Verification Agent 150, a CSC deployment manager 152 and a graphical user interface (GUI) 154. For the sake of the following examples, RCCG 117 is assumed to be stored on CRSM 112 (FIG. 1) and execute on computer 102 (FIG. 1). It should be understood that the claimed subject matter can be implemented in many types of computing systems and data storage structures but, for the sake of simplicity, is described only in terms of computing system 102 and system architecture 100 (FIG. 1). Further, the representation of RCCG 117 in FIG. 2 is a logical model. In other words, components 140, 142, 144, 146, 148, 150, 152 and 154 may be stored in the same or separates files and loaded and/or executed within system 100 either as a single system or as separate processes interacting via any available inter process communication (IPC) techniques.

I/O module 140 handles any communication RCCG 117 has with other components of computing system 102 and architecture 100. Data module 142 is a repository for information, including thresholds, rules, test cases and parameters, that RCCG 117 requires during normal operation. Examples of the types of information stored in data module 142 include CSC Generating Threshold and Rules (T&R) 156, a test case pool 158 and operating parameters 160.

T&R 156 stores information that is specific to the generation of CSCs. Examples of information stored in T&R 156 may be a number of times and/or throughputs (converted bytes) of a universal convertor have been loaded in a certain time period. For instance, a new convertor, IBM-937_big5, may be built if IBM-937_big5 related conversion has been deployed more than 100 times in past 24 hours or a new convertor, big5_IBM-937, will be created if related throughput exceeds 60 MB in past 30 minutes. T&R 156 may also store related predefined and customized restrictions, generation rules, conversion algorithms, and/or search and loading priorities. For example, we can predefine a rule such as only one-to-one mapped convertors can be automatically generated by default. Predefined T&R 156 may also be customizable. For example a user may want to add one-to-many or many-to-many rules to generate and verify a new convertor.

Test case pool 158 stores information relating to previous iterations of RCCG 117, specifically test cases that have been generated and that may be employed in current and future operation of RCCG 117. Operating parameters 160 stores information that controls some operations of RCCG 117. Examples include, but are not limited to, the location of log files and CSC repositories.

UMA 144 is responsible monitoring, logging, and analyzing CSC operations at an OS level. In other words, the data of CSC loading times and total throughputs for each CSC are recorded, analyzed, and updated. UMA may be "turned on" or "turned off" occasionally or permanently based on predefined rules stored in T&R 156.

Mapping Table Maker (MTM) 146 is responsible for generating a CSC table (see 310, 312, 314 and 316, FIG. 7) based upon intermediate CSCs that have been retrieved using the disclosed techniques. CSC compiler 148 converts the CSC table generated by MTM 146 into a binary form that the iconv API may utilize. CS Verification Agent 150 generates test cases that may be employed by a programmer or system administrator to verify the binary CSC generated by CSC compiler 148. CSC Deployment manager 152 is responsible for implementing a CSC that has been compiled by CSC compiler 148 and verified by CSC Verification Agent 150.

GUI 154 enables users such as programmers and system administrators of RCCG 117 to interact with and to define the desired functionality of RCCG 117, typically by the setting of parameters in operating parameters 160. In addition, GUI 154 enables users to be directly involved in the testing and verification of CSCs generated in accordance with the claimed subject matter.

Figure 3:
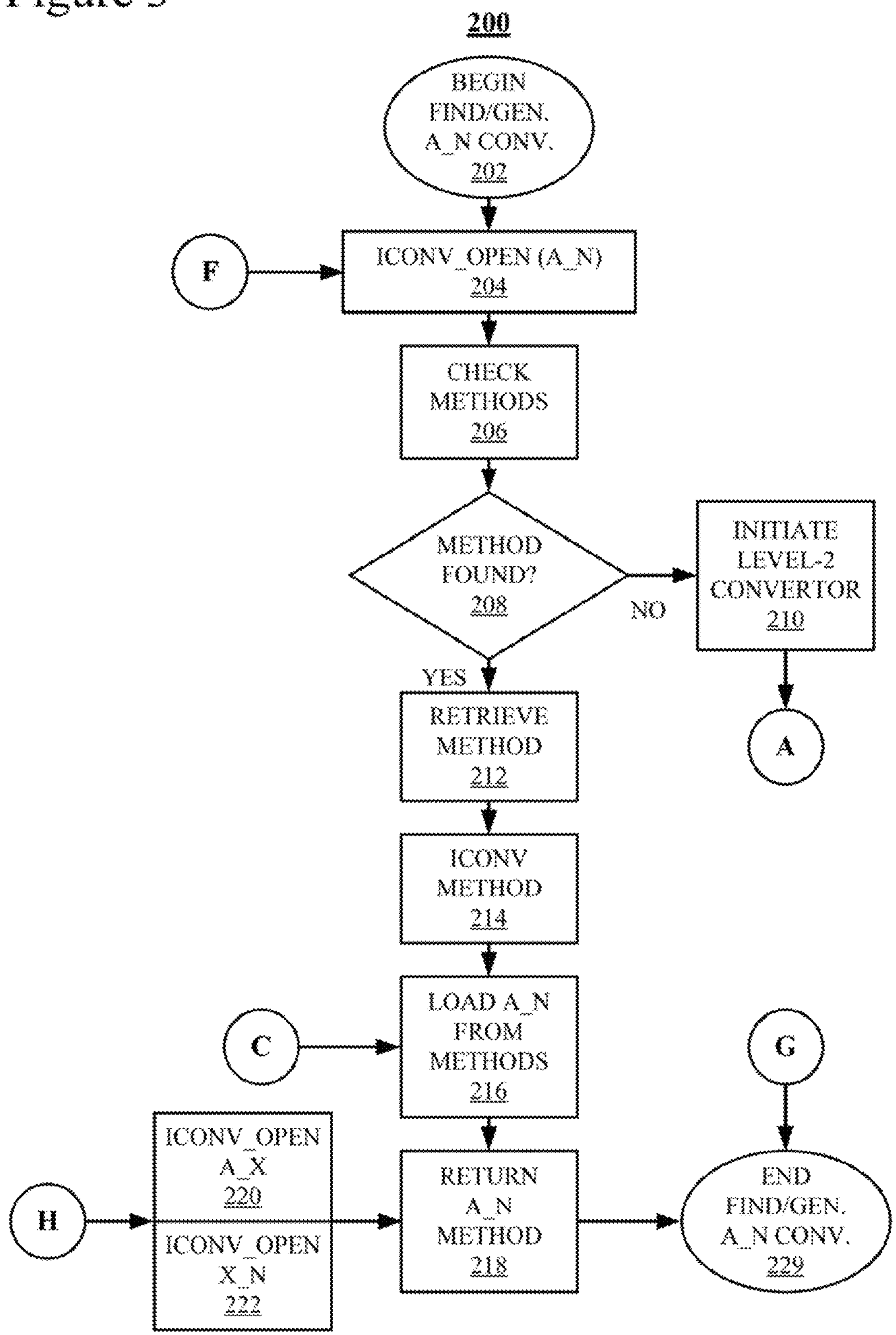
FIG. 3 is a flowchart of one example of a Find/Generate (Find/Gen.) A_N Convertor process, associated with a first level (Level-1) processing of an Extended Universal Convertor Module (EUCM) of FIG. 1, that may implement aspects of the claimed subject matter.

FIG. 3 is a flowchart of one example of a Find/Generate (Find/Gen.) A_N Convertor process 200, associated with a first level (Level-1) processing of the EUCM 116 of FIG. 1, that may implement aspects of the claimed subject matter. In this example, logic associated with process 200 is stored on CRSM 112 (FIG. 1) as part of EUCM 116 and executed on one or more processors (not shown) of CPU 104. In the following example, 'A' represents a source code set and 'N' represents a target code set. In other words, there is a need to convert a code set A into a code set N.

Process 200 starts in a "Begin Find/Generate (Gen.) A_N Convertor (Conv.)" block 202 and proceeds immediately to a "iconv_open (A_N)" block 204. During block 204, the iconv API is called with parameters that designate 'A' as the source code set and 'N' as the destination code set. During processing associated with a "Check Methods" block 206, existing methods are searched for the existence of an existing CSC that converts an 'A' code set to an 'N' code set. Such CSC may be already be located in memory of computing system 102 in Binary CSCs 115 (FIG. 1) or located in another repository such as Level-1 CSC list 128 (FIG. 1), which in this example is at a remote location.

During processing associated with a "Method Found?" block 208, a determination is made as to whether or not an appropriate A_N CSC has been located in existing methods. If not, control proceeds to an "Initiate Level-2 Convertor" block 210. During processing associated with block 210, a level-2 conversion process (see 230, FIG. 4) is initiated and control is transferred via a transition point A.

If, during processing associated with block 208, a determination is made that an existing method has been located, control proceeds to a "Retrieve Method" block 212. During processing associated with block 212, the method located during processing associated with block 206 is retrieved from memory, i.e. in this example, either binary CSC 115 or Level-1 CSC list 128. During processing associated with a "iconv Method" block 214, iconv API is called with the method retrieved during processing associated with block 212. During processing associated with a "Load A_N From Methods" block 216, iconv loads the method and, during processing associated with a "Return A-N Method" block 218, a pointer is returned so that the calling process has access to the method. Finally, during processing associated with an "End Find/Gen A_N Conv." block 229, process 200 is complete. An "iconv_open (A_X)" block 220 and an "iconv_open (X-N)" block 222 are described below in conjunction with FIG. 7. Transition points 'C', 'F', 'G' and 'H' represent entry into process 200 from other processes and are explained below in conjunction with FIGS. 4-7.

Figure 4:
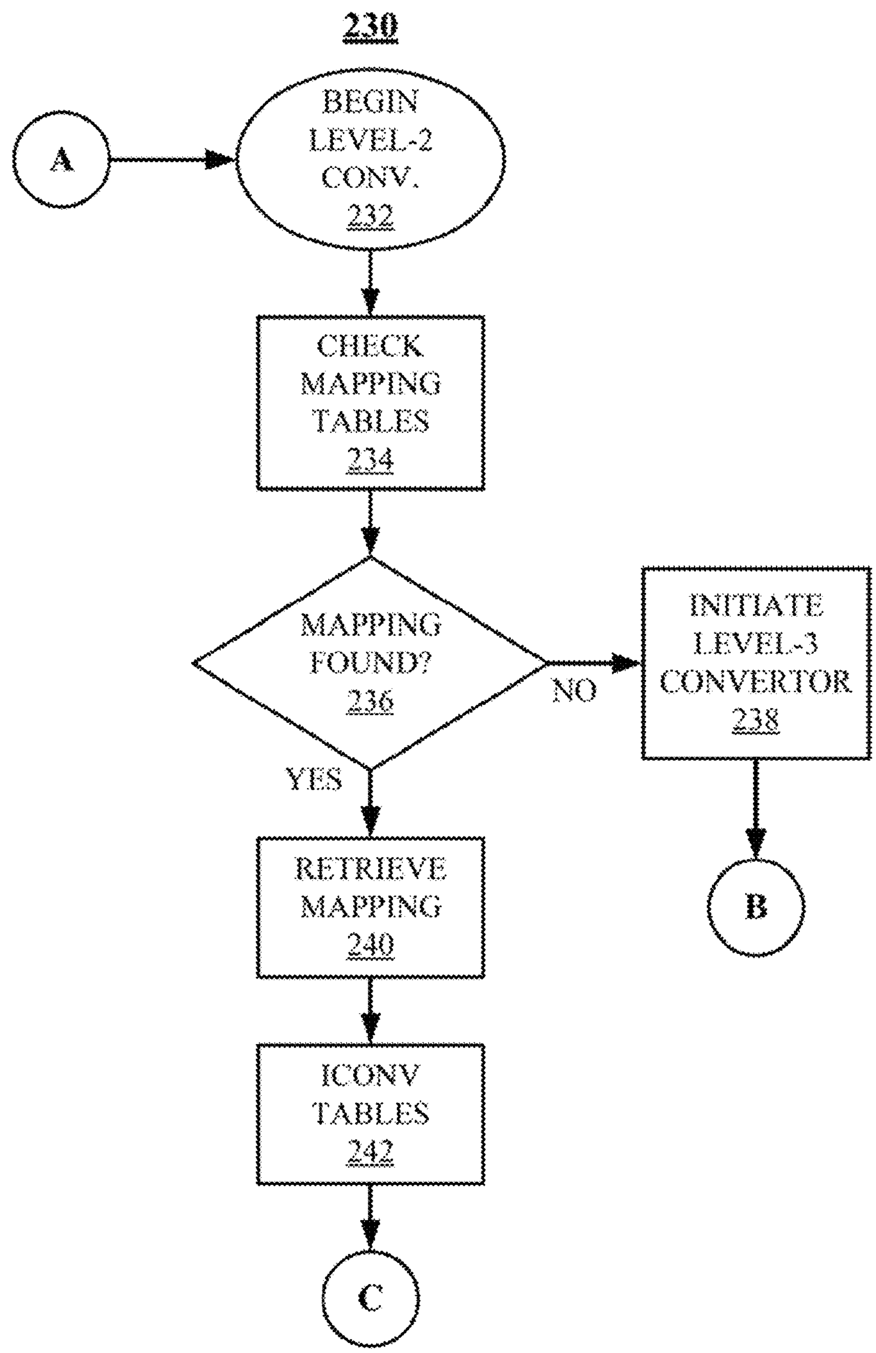
FIG. 4 is a flowchart of one example of Level-2 Convertor (Conv.) process, associated with the EUCM of FIG. 1, that may implement aspects of the claimed subject matter.

FIG. 4 is a flowchart of one example of Level-2 Convertor (Conv.) process 230, associated with the EUCM 116 of FIG. 1, that may implement aspects of the claimed subject matter. Like process 200 of FIG. 3, logic associated with process 230 is stored on CRSM 112 (FIG. 1) as part of EUCM 116 and executed on one or more processors (not shown) of CPU 104. Process 230 is entered via transition point A, first introduced above in conjunction with FIG. 3.

Process 230 starts in a "Begin Level-2 Convertor (Conv.)" block 232 and proceeds immediately to a "Check Mapping Tables" block 234. During block 234, MTs 118 (FIG. 1) are consulted to locate any potential mapping between the source and target code sets, which in his example are code sets 'A' and 'N', respectively. For example, there might be a mapping that specifies a first CSC for a conversion between code set 'A' and a code set 'X' and a second mapping that specifies a second CSC for a conversion between code set 'X' and code set 'N'.

During processing associated with a "Mapping Found?" block 236, a determination is made as to whether or not a mapping has been identified during processing associated with block 234. If not, control proceeds to an "Initiate Level-3 Convertor" block 238. During processing associated with block 238, a level-3 conversion process (see 260, FIG. 5) is initiated and control is transferred via a transition point B.

If, during processing associated with block 236, a determination is made that a viable mapping has been located, control proceeds to a "Retrieve Mapping" block 240. During processing associated with block 240, the tables found, a table of A-X conversion and one for X-N conversion are retrieved. During processing associated with an "iconv Tables" block 242, each table retrieved during processing associated with block 240 are processed with the iconv API. Control then proceeds, via a transition point C (FIG. 3) to Load A-N from methods block 216 (FIG. 3) and processing continues as describe above.

Figure 5:
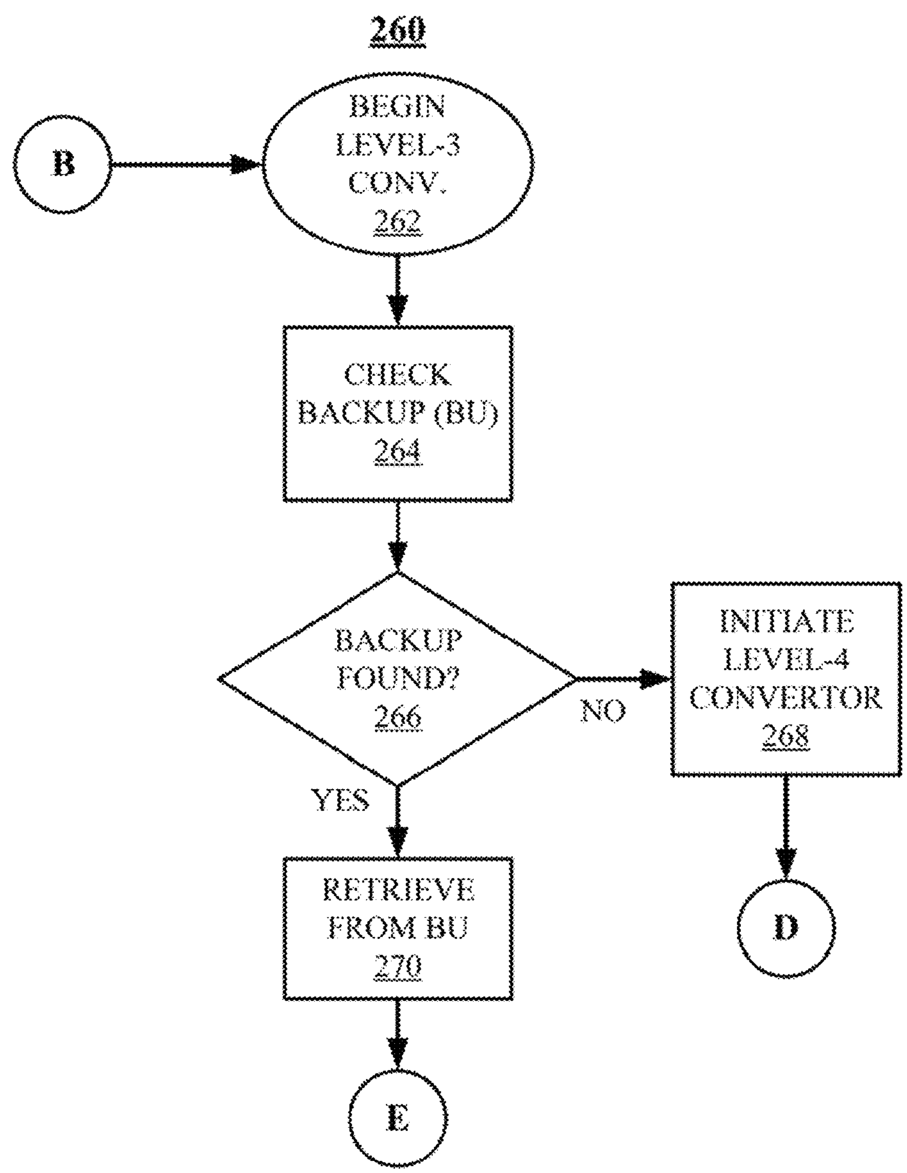
FIG. 5 is a flowchart of one example of a Level-3 Conv. process, associated with the EUCM of FIG. 1, that may implement aspects of the claimed subject matter.

FIG. 5 is a flowchart of one example of a Level-3 Conv. process 260, associated with the EUCM of FIG. 2, that may implement aspects of the claimed subject matter. Like processes 200 of FIG. 3 and process 230 of FIG. 4, logic associated with process 260 is stored on CRSM 112 (FIG. 1) as part of EUCM 116 (FIG. 1) and executed on one or more processors (not shown) of CPU 104. Process 260 is entered via transition point B, first introduced above in conjunction with FIG. 4.

Process 260 starts in a "Begin Level-3 Convertor (Conv.)" block 262 and proceeds immediately to a "Check Backup (BU)" block 264. During block 264, BMTs 119 are consulted to determine any if there are any backup A-N convertors. During processing associated with a "Backup Found?" block 266, a determination is made as to whether or not an appropriate backup table has been located. If not, control proceeds to an "Initiate Level-4 Convertor" block 268. During processing associated with block 268, a level-4 conversion process (see 280, FIG. 6) is initiated and control is transferred via a transition point D.

If, during processing associated with block 266, a determination is made that a backup convertor has been found, control proceeds to a "Retrieve From Backup" block 270. During processing associated with block 270, the backups found, a table of A-X conversion and one for X-N conversion are retrieved. Control then proceeds, via a transition point E, to a Generate CSC process 300 (see FIG. 7).

Figure 6:
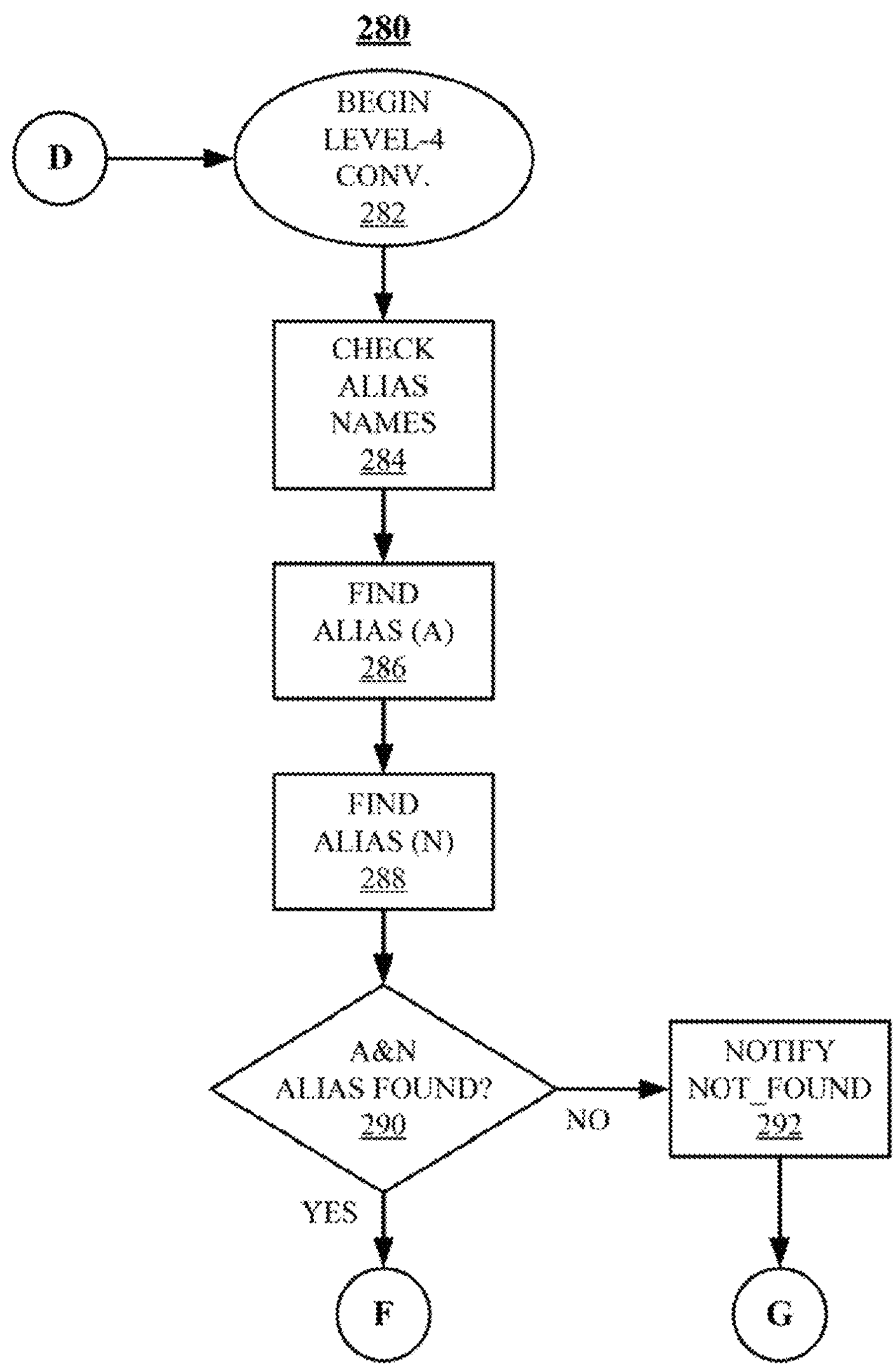
FIG. 6 is a flowchart of one example of a Level-4 Conv. process, associated with the EUCM of FIG. 1, that may implement aspects of the claimed subject matter.

FIG. 6 is a flowchart of one example of a Level-4 Conv. process 280, associated with the EUCM of FIG. 1, that may implement aspects of the claimed subject matter. Like processes 200 of FIG. 3, process 230 of FIG. 4 and process 260 of FIG. 5, logic associated with process 280 is stored on CRSM 112 (FIG. 1) as part of EUCM 116 and executed on one or more processors (not shown) of CPU 104. Process 280 is entered via transition point D, first introduced above in conjunction with FIG. 5.

Process 280 starts in a "Begin Level-4 Convertor (Conv.)" block 282 and proceeds immediately to a "Check Alias Names" block 284. During block 284, a search is conducted for alternative names for the source and target code sets. During processing associated with a "Find Alias (A)" block 286, an alternative name for code set A is identified, it possible. During processing associated with a "Find Alias (N)" block 288, an alternative name for code set N is identified, it possible. A code set alias list (not shown) is typically prebuilt and shipped with conversion libraries or shipped separately for customizing. In UNIX, default alias list may be directly built and shipped with /usr/lib/libiconv.a and iconv_open automatically finds the best fit alias name.

During processing associated with an "A and/or N Alias Found?" block 290, a determination is made as to whether or not alternative names for one or both of code sets 'A' and 'N' have been found. If so, control proceeds, via a transition point F, back to iconv_open (A_N) block 204 (FIG. 3). Rather than code set A and code set N being processed the processing focuses on the aliases for A and or N found during processing associated with block 288.

If, during processing associated with block 290, a determination is made as that an alias for neither code set A nor code set N have been found, control proceeds to a "Notify Not-_Found" block 292. During processing associated with block 292, an administrator or other user is notified that no conversion between code sets 'A' and 'N' has been found. Control then proceeds, via a Transition Point G, to End Find/Gen. Conv. block 219 (FIG. 3) in which process 200 is complete as described above in conjunction with FIG. 3

Figure 7:
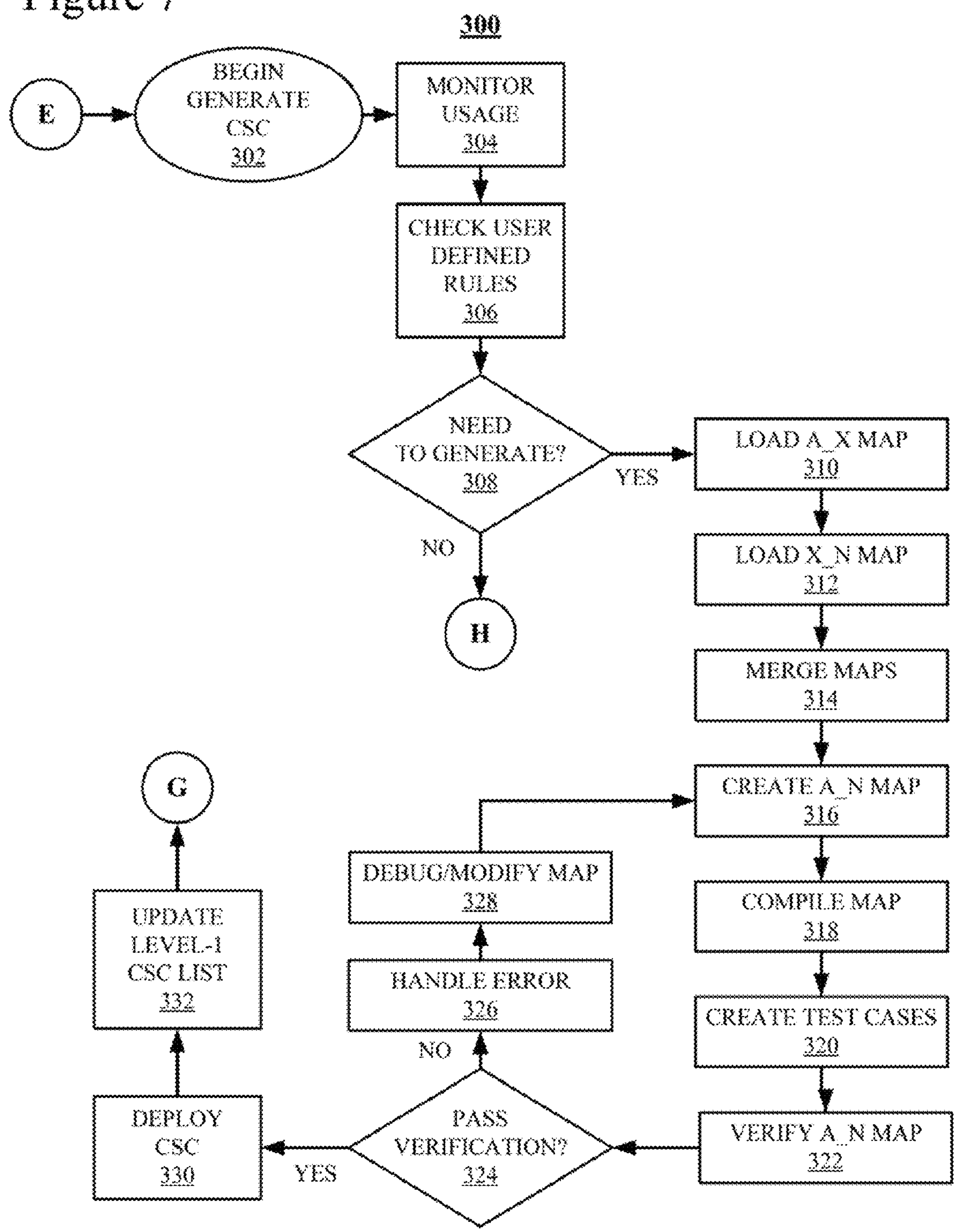
FIG. 7 is a flowchart of one example of Generate Code Set Convertor (CSC) process, associated with RCCG of FIGS. 1 and 2, that may implement aspects of the claimed subject matter.

FIG. 7 is a flowchart of one example of Generate Code Set Convertor (CSC) process 300, associated with EUCM of FIG. 1 and RCCG of FIGS. 1 and 2, that may implement aspects of the claimed subject matter. Like processes 200 of FIG. 3, process 230 of FIG. 4, process 260 of FIG. 5 and process 280 of FIG. 6, logic associated with process 280 is stored on CRSM 112 (FIG. 1) as part of EUCM 116 (FIG. 1) and executed on one or more processors (not shown) of CPU 104 of computing system 102 (FIG. 1). Process 300 is entered via transition point E, first introduced above in conjunction with FIG. 5.

Process 300 starts in a "Begin Generate Code Set Convertor (CSC)" block 302 and proceeds immediately to a "Monitor Usage" block 304 (see 144, FIG. 2). During block 304, UMA, which may be turned on and off either occasionally or permanently based upon predefined rules as needed, monitors, logs, and analyzes all CSC operations at the OS level. In other words, the data of CSC loading times and total throughputs for each CSC is recorded, analyzed, and updated. For example, the number of CSC loading monitoring may include logging of API iconv_open( ) or iconv_close( ) at the OS level. For instance, if iconv_open(big5, IBM-937) has been called 100 times in past 1 minute, then it indicates there were 100 IBM-937_big5 requests in the past 1 minute. In addition, data throughput of iconv( ) also may be used.

During processing associated with a "Check User Defined Rules" block 306, information from CSC Generating Threshold and Rules 156 (FIG. 2) is loaded and evaluated based upon the information generated during processing associated with block 304. During processing associated with a "Need to Generate?" block 308, a determination is made as to whether or not a new CSC should be generated based upon the rules and thresholds loaded during processing associated with block 306. If not, control proceeds via a transition point H to a iconv_open (A-X block 220 (FIG. 3) and iconv_open (X-N) block 222 (FIG. 3) and processing continues as describe above.

If, during processing associated with block 308, a determination is made that a CSC should be generated, control proceeds to a "Load A_X Map" block 310. During processing associated with block 310, an A_X map, retrieved during processing associated with block 270 (FIG. 5) is loaded and, during processing associated with a "Load X_N Map" block 312, a map retrieved during processing associated with block 270, is loaded.

During processing associated with a "Merge Maps" block 314, the maps loaded during processing associated with blocks 310 and 312 are merged into a single map. During processing associated with a "Create A_N Map" block 316, the merged map created during processing associated with block 314 is generated (see 146, FIG. 2). During processing associated with a "Compile Map" block 318, the map generated during processing associated with block 316 is compiled into a binary CSC (see 148, FIG. 2).

During processing associated with a "Create Test Cases" block 320, test cases are generated to ensure that the map generated during processing associated with block 316 is accurate. Test cases may be based upon previously generated test cases stored in test case pool 158 (FIG. 2). During processing associated with block "Verify A_N Map" block 322, the map is verity using the test cases created during processing associated with block 320 (see 150. FIG. 2).

During processing associated with a "Pass Verification?" block 324, a determination is made as to whether or not the map generated during processing associated with block 316 is able to be verified. If not, control proceeds to a "Handle Error" block 326. During processing associated with block 326, any errors exposed during processing associated with block 322 are addressed. During processing associated with a "Debug/Modify Map" block 328, the map is modified to correct the issues identified during processing associated with blocks 322 and 326. Control then returns to block 316, during which the corrected map is generated and processing continues as described above.

If, during processing associated with block 324 a determination is made that the map generated during processing associated with block 316 has been verified, control proceeds to a "Deploy CSC" block 330. During processing associated with block 330, the verified map is loaded into binary CSCs 115 (FIG. 1) of computing system 102. During processing associated with an "Update Level-1 CSC List" block 332, an entry is provided into Level-1 CSC List 128 (FIG. 1) so that the map may be made available for other processes and computing systems. Finally, control proceeds, via a transition point G, to End Find/Gen. A_N Conv. block 229 and processes 300 and 200 are complete.

The terminology used herein is for the purpose of describing particular embodiments only and is not intended to be limiting of the invention. As used herein, the singular forms "a", "an" and "the" are intended to include the plural fotrms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

We claim:

1. A method, comprising:

detecting a mapping, by a universal convertor, of a first character set to a second character set and of the second character set to a third character set;

generating an updated character set conversion module from the first character set to the third character set in response to the detecting; and storing the updated character set conversion module for utilization of subsequent processing of the first character set to the third character set.

2. The method of claim 1, wherein the updated character set conversion module is stored in conjunction with a default character set conversion table.

3. The method of claim 1, further comprising:

monitoring, logging, and analyzing code set conversion (CSC) operations; and determining that the CSC operations corresponding to mapping exceed a predefined threshold;

wherein the generating is in response to both the detecting of the mapping and the determining that the CSC operations exceed the threshold.

4. The method of claim 1, wherein the monitoring is performed at an operating system level.

5. The method of claim 1, wherein the updated character set conversion is employed by an operating system.

6. The method of claim 1, wherein the character set conversion module is configured as an iconv utility.

7. The method of claim 1, further comprising:

bypassing the universal convertor during the subsequent processing; and employing the updated character set conversion module for the subsequent processing of the first character set to the third character set.

8. An apparatus, comprising:

a processor;

a non-transitory, computer-readable storage medium coupled to the processor; and logic, stored on the computer-readable storage medium and executed on the processor, for:

detecting a mapping, by a universal convertor, of a first character set to a second character set and of the second character set to a third character set;

generating an updated character set conversion module from the first character set to the third character set in response to the detecting; and storing the updated character set conversion module for utilization of subsequent processing of the first character set to the third character set.

9. The apparatus of claim 8, wherein the updated character set conversion module is stored in conjunction with a default character set conversion table.

10. The apparatus of claim 8, the logic further comprising logic for:

monitoring, logging, and analyzing code set conversion (CSC) operations; and determining that the CSC operations corresponding to mapping exceed a predefined threshold;

wherein the generating is in response to both the detecting of the mapping and the determining that the CSC operations exceed the threshold.

11. The apparatus of claim 8, wherein the monitoring is performed at an operating system level.

12. The apparatus of claim 8, wherein the updated character set conversion is employed by an operating system.

13. The apparatus of claim 8, wherein the character set conversion module is configured as an iconv utility.

14. The apparatus of claim 8, the logic further comprising logic for:

bypassing the universal convertor during the subsequent processing; and employing the updated character set conversion module for the subsequent processing of the first character set to the third character set.

15. A computer programming product, comprising a non-transitory, computer-readable storage medium; and logic, stored on the computer-readable storage medium for execution on a processor, for:

detecting a mapping, by a universal convertor, of a first character set to a second character set and of the second character set to a third character set;

generating an updated character set conversion module from the first character set to the third character set in response to the detecting; and storing the updated character set conversion module for utilization of subsequent processing of the first character set to the third character set.

16. The computer programming product of claim 15, the logic further comprising logic for:

monitoring, logging, and analyzing code set conversion (CSC) operations; and determining that the CSC operations corresponding to mapping exceed a predefined threshold;

wherein the generating is in response to both the detecting of the mapping and the determining that the CSC operations exceed the threshold.

17. The computer programming product of claim 15, wherein the monitoring is performed at an operating system level.

18. The computer programming product of claim 15, wherein the updated character set conversion is employed by an operating system.

19. The computer programming product of claim 15, wherein the character set conversion module is configured as an iconv utility.

20. The computer programming product of claim 15, the logic further comprising logic for:

bypassing the universal convertor during the subsequent processing; and employing the updated character set conversion module for the subsequent processing of the first character set to the third character set.

* * * * *